United States Patent
Quaderer et al.

(10) Patent No.: US 6,312,574 B1
(45) Date of Patent: Nov. 6, 2001

(54) TARGET, MAGNETRON SOURCE WITH SAID TARGET AND PROCESS FOR PRODUCING SAID TARGET

(75) Inventors: Hans Quaderer; Juergen Weichart, both of Liechtenstein (LI)

(73) Assignee: Unaxis Balzers Aktiengesellschaft, Fuerstentum (LI)

( * ) Notice: Subject to any disclaimer, the term of this patent is extended or adjusted under 35 U.S.C. 154(b) by 0 days.

(21) Appl. No.: 09/157,408

(22) Filed: Sep. 21, 1998

Related U.S. Application Data (63) Continuation-in-part of application No. PCT/CH97/00114, filed on Mar. 19, 1997.

(30) Foreign Application Priority Data

Mar. 19, 1996 (CH) ........................................ 724/96

(51) Int. Cl.[7] .................................................. C23C 14/35
(52) U.S. Cl. ............................... 204/298.17; 204/298.12; 204/298.13
(58) Field of Search ......................... 204/298.12, 298.13, 204/298.16, 298.17

(56) References Cited

U.S. PATENT DOCUMENTS

| | | | | |
|---|---|---|---|---|
| 4,299,678 | * | 11/1981 | Meckel | 204/192 M |
| 4,401,546 | * | 8/1983 | Nakamura et al. | 204/298 |
| 4,412,907 | * | 11/1983 | Ito et al. | 204/298 |
| 4,430,190 | * | 2/1984 | Eilers et al. | 204/298 |
| 4,752,335 | * | 6/1988 | Korb | 75/249 |
| 4,865,708 | | 9/1989 | Welty | 204/192.12 |
| 4,879,017 | | 11/1989 | Lee | 204/298 |
| 4,915,810 | * | 4/1990 | Kestigian et al. | 204/298.04 |

FOREIGN PATENT DOCUMENTS

| | | | | |
|---|---|---|---|---|
| 210858 | * | 2/1987 | (EP) | H01J/37/32 |
| 89/10429 | * | 11/1989 | (WO) | C23C/14/34 |

OTHER PUBLICATIONS

Patent Abstracts of Japan, vol. 10, No. 288, (P–502), AB. Date: Sep. 30, 1986, Publ. No. JP611056510, Publ. Date: May 23, 1986.

Patent Abstracts of Japan, vol. 12, No. 365 (C–532) AB. Date: Sep. 29, 1988 Publ. No. JP63118067, Publ. Date: May 23, 1988.

* cited by examiner

*Primary Examiner*—Nam Nguyen
*Assistant Examiner*—Steven H. Ver Steeg (57) ABSTRACT

A ferromagnetic magnetron target contains a pattern of blind holes with a circular cross-section distributed along a sputtering surface thereof. A process produces the target for a given magnetron source with a given tunnel field and includes determining and storing the tunnel field course when individual blind holes are provided in a new target surface, additively superimposing the determined tunnel field course of plural individual blind holes, comparing the resulting tunnel field course with a DESIRED tunnel field course; and changing, as a function of the comparison result, the relative parameter position of one or more of the individual blind holes, or the like to control the working of blind holes into the plane target sputtering surface. An arrangement produces a target from a ferromagnetic material for a given magnetron source with a given tunnel field, with a course addition unit which is operatively connected on the input side of the input unit and which, on the output side, leads to one input of a course comparison unit, at whose second input a desired course can be fed and whose output feeds back to the adjusting inputs at the input unit. The adjusting inputs are operatively connected with an output for the triggering of a blind hole production device for the target.

11 Claims, 10 Drawing Sheets

TARGET, MAGNETRON SOURCE WITH SAID TARGET AND PROCESS FOR PRODUCING SAID TARGET

CROSS-REFERENCE TO RELATED APPLICATIONS

This application is a continuation-in-part of PCT Application No. PCT/CH97/00114 and Swiss Application No. 724/96 filed on Mar. 19, 1997 and Mar. 19, 1996, respectively.

BACKGROUND OF THE INVENTION

The present invention relates to a target made of a ferromagnetic material, a magnetron source, a magnetron sputtering system and to a process for producing a target made of a ferromagnetic material.

It is known that magnetron sputtering sources have a target as well as a magnet arrangement situated underneath. This magnet arrangement generates above the sputtering surface of the target a tunnel-shaped stray field which is normally looped in itself and which is decisive for the effect of the sputtering source as the magnetron sputtering source. During the magnetron sputtering of targets made of a ferromagnetic material, the latter act as a magnetic short circuit. Therefore, a sufficient tunnel-shaped stray field can be implemented only in the case of relatively thin target plates or else very strong magnets must be used. Nevertheless, the service life of the target and its yield of material remain low because, as soon as the formation of the erosion trough starts at the target, the stray field intensity in the trough area will increase which, in the sense of a regenerative system, results in an increasing contraction of the erosion trough with a correspondingly poorer yield of target material and a high rate loss by the sputtering deposit on the target.

U.S. Pat. Nos. 4,401,546 and 4,412,907 and DE-A-32 23 245 describe attempts to solve this problem by segmenting the target plate bonded onto a carrier plate to the carrier plate by way of slots. The division of the target plate into individual components requires extremely high manufacturing and cost expenditures. In addition, it must be ensured by the appropriate design of the intermediate spaces that the contamination of the sputtering process by the carrier plate material is minimized.

U.S. Pat. No. 4,299,678 suggests that the above-addressed problem can be counteracted in such a manner that grooves are machined into the target plate which do not extend therethrough, but instead the ferromagnetic target material is heated above Curie temperature.

In addition to the working-in of the surrounding groove pattern, in this case, the heating of the target, in particular, also requires extremely high expenditures. For example, heating to above 350° C. is required for a nickel target.

Finally, EP-0 210 858 describes targets which have a blind hole pattern. They are used for non-magnetron high-frequency sputtering and consist, for example, of Mo, Cu, C or $SiO_2$. Other metallic and dielectric materials can also be used. The blind holes are dimensioned such that one cylindrical cathode charge respectively burns therein, whereby a particularly high plasma density is to be achieved. An alternative approach is used in this case for high-frequency sputtering for the magnetron sputtering which is rare in the case of high-frequency applications.

SUMMARY OF THE INVENTION

An object of the present invention is to provide a target made of a ferromagnetic material, a magnetron source with such a target. Further, the present invention provides a magnetron sputtering system with such a source, on which high service lives are achieved with respect to the target, while the material is utilized well. The targets preferably have a rectangular or circular-plate shape.

Furthermore, an object of the present invention is to implement a manufacturing process for such targets.

On the target of the present invention, the above-mentioned object is achieved by providing a pattern of blind holes along the sputtering surface.

BRIEF DESCRIPTION OF THE DRAWINGS

These and further objects, features and advantages of the present invention will become more apparent from the following detailed description of a currently preferred embodiments when taken in conjunction with the accompanying drawings wherein.

DETAILED DESCRIPTION OF THE DRAWINGS

According to FIG. 1, a target according to the invention made of a ferromagnetic material, particularly of nickel or a nickel alloy, such as NiFe, has a pattern of blind holes on its sputtering surface. These may be worked into the target plate 1, as illustrated in FIGS. 1a to 1c, for example, by drilling. Preferably, the blind holes 3 are rotationally symmetrical with respect to the axis L.

Figure 1A:
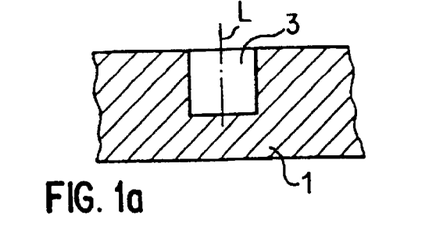
FIGS. 1a to 1f are partial side views of one cutout of different embodiments of a target provided with blind hole bores according to the present invention.
Figure 1B:
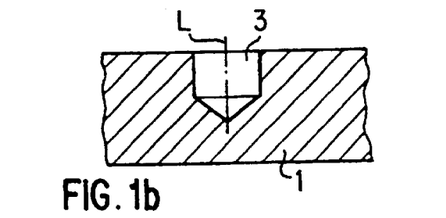
Figure 1C:
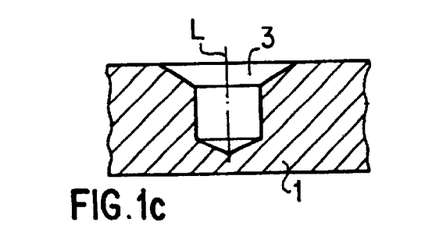
Figures 1D, 1E:
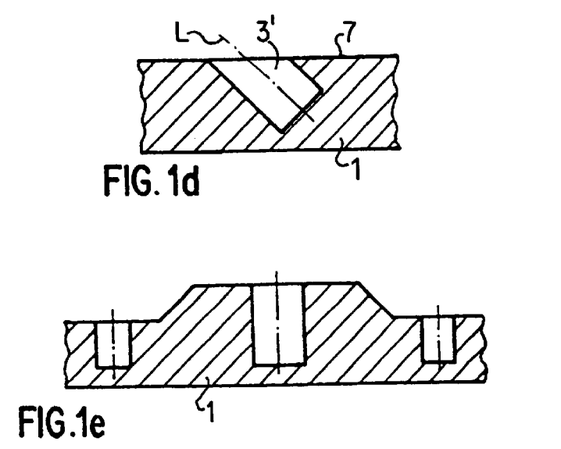

According to FIG. 1d, the blind holes 3 provided according to the invention, as illustrated at reference number 3', may also be worked in at an oblique angle with respect to the new sputtering surface 7 of the target.

Further, according to FIG. 1e, in a construction of the blind holes provided by the invention according to one or several embodiment(s) illustrated in FIGS. 1a to 1d, the thickness dimension of the target 1 may be stepped, which also influences the course or shape of the tunnel field.

Figure 1F:
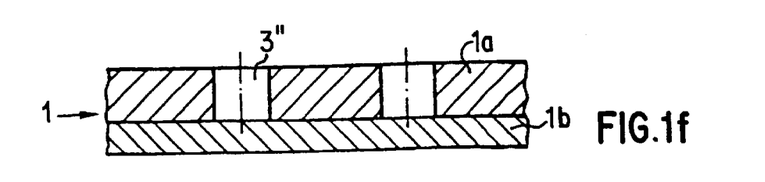

According to FIG. 1f, the target, which is again provided with blind holes according to one of FIGS. 1a to 1d, is constructed in two parts—of an upper plate 1a and of a lower plate 1b—, preferably made of the same materials. The upper plate 1a is drilled through for establishing the blind holes 3". This may result, for example, in important manufacturing advantages.

Figure 2:
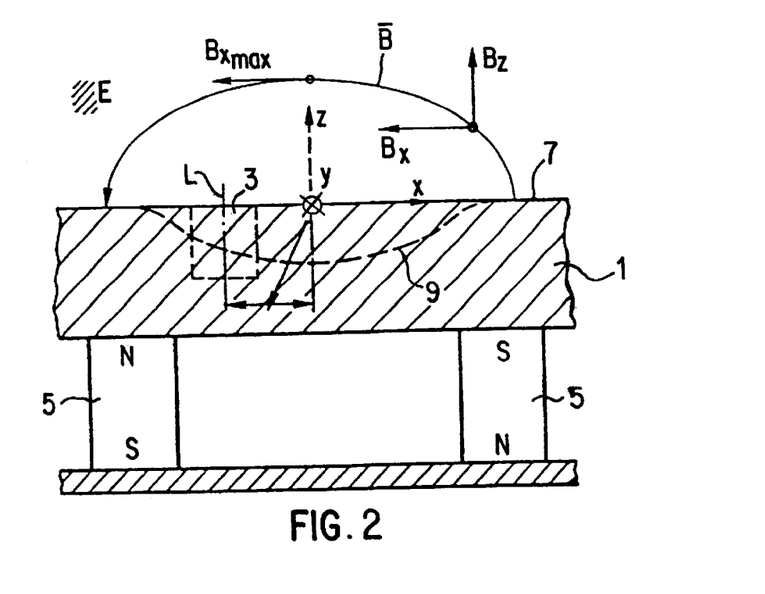
FIG. 2 is a schematic cutout of a magnetron source having a target according to the present invention, also for defining the quantities described hereinafter.

The terms used in the following description are defined by reference to FIG. 2. In FIG. 2, the broken or dash line indicates one of the several blind holes 3 provided according to the present invention. The magnet arrangement 5 produces the tunnel-shaped stray field $\overline{B}$.

Definitions

Tunnel Field: The total field pattern of the magnetic stray field B of the magnetron source which emerges from the target sputtering field and returns into it, with the component $B_z$ perpendicularly to the new sputtering surface 7 and the component $B_x$ parallel to the new surface 7. The lines $\overline{B}$ of electric flux extend in respective planes E perpendicularly to the new surface 7.

Tunnel Axis y: Corresponding to the coordinate axis y Location on the new surface 7, above which $B_x$ is maximal and $B_z$ is diminishing.

x-Coordinate x/v/z System: With the origin on the tunnel axis y, perpendicular to y in the new surface 7. This results in the x/y/z system.

Erosion Trough 9: The increasingly deep area of sputtered-off material which extends essentially under the area T of the tunnel field $\overline{B}$.

New Surface 7: Non-sputtered target sputtering surface.

Field Intensity $B_{ox}$: Field intensity component in the x-direction which, when the new surface is not perforated, occurs directly on its surface.

$B_{lx}$: The field intensity in the x-direction which occurs in the area of a blind hole provided according to the present invention.

$B_{lxmax}$: Field intensity maximal value.

$\Delta B_x$: Stray field elevation. The difference between field $B_{lx}$ measured at the same location in the area of a blind hole provided according to the invention and field $B_{ox}$ measured at the same location.

$B_{rx}$: The course path or source of the field in the x-direction occurring when several blind holes are provided.

Hole Offset V: The offset of the central axis L of a blind hole provided according to the invention perpendicularly to the tunnel axis y.

Useful Sputtering Rate NZ: The amount of material in grams sputtered per kWh and usable over the target.

Degree of Utilization N: The percentage of the proportion of the sputtered material which can be used above the eroded target surface, relative to the new weight of the target.

According to the invention, the distribution of the provided blind holes 3 in the target sputtering surface influences the tunnel field in a targeted manner in order to provide in a targeted manner, on one hand, the useful sputtering-off rate distribution (the useful sputtering-off rate per se) and, on the other hand, the desired forming erosion profile.

Figure 3:
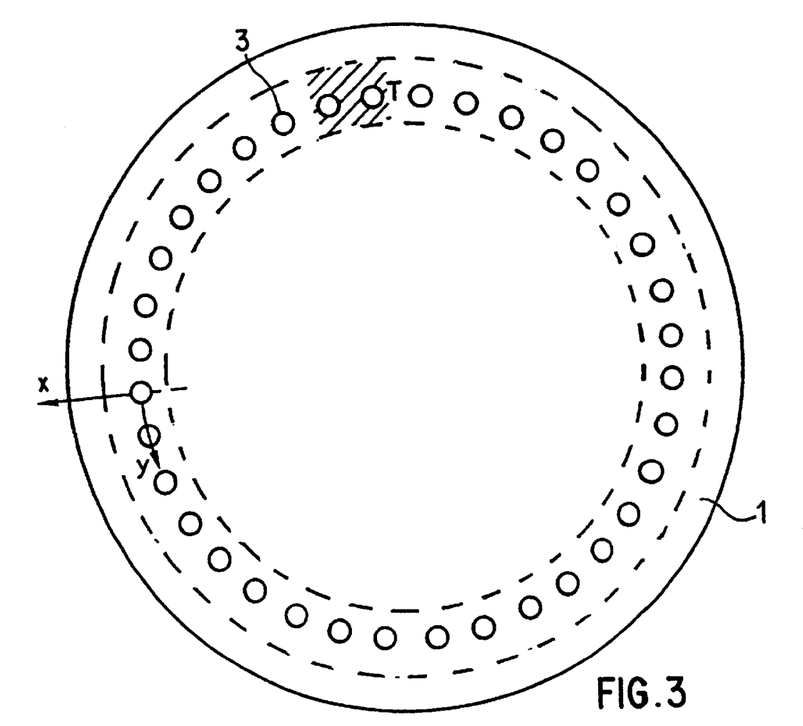
FIG. 3 is a view of a currently preferred embodiment of a round target according to the invention with a minimal hole pattern.

FIG. 3 illustrates a simplified embodiment of the round target according to the invention wherein a pattern of blind holes 3 is provided in the area T, preferably defining a closed loop, i.e. which is closed in itself, preferably also a circular loop in T. The selective configuration of the hole spacing in the y-direction, of the offset V and of the hole diameters as well as of the hole profiling (see, for example, FIG. 1c), further of the alignment of the hole axes L (see, for example, FIG. 1d), and/or of the thickness profiling (see, for example, FIG. 1e), permits the resulting field $B_{rx}$ to be configured as desired within wide limits.

Figure 4:
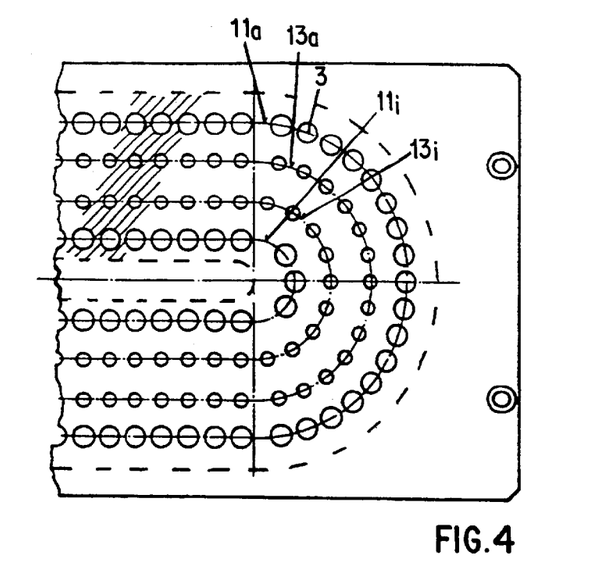
FIG. 4 is a top view of a rectangular target with an improved hole pattern according to the present invention.

FIG. 4 is a top view of an end section of a rectangular target. As illustrated, four loops of blind holes 3 are provided here; i.e. an outermost loop $11_a$ and an innermost loop $11_i$ with blind holes having a larger diameter. Two loop patterns $13_a$ and $13_i$ of blind holes are situated in between and have smaller diameters. An arrangement with several loop patterns in or close to the T region permits implementation thereabove of, for example, an optimally homogeneous field $B_{rx}$.

Figure 5:
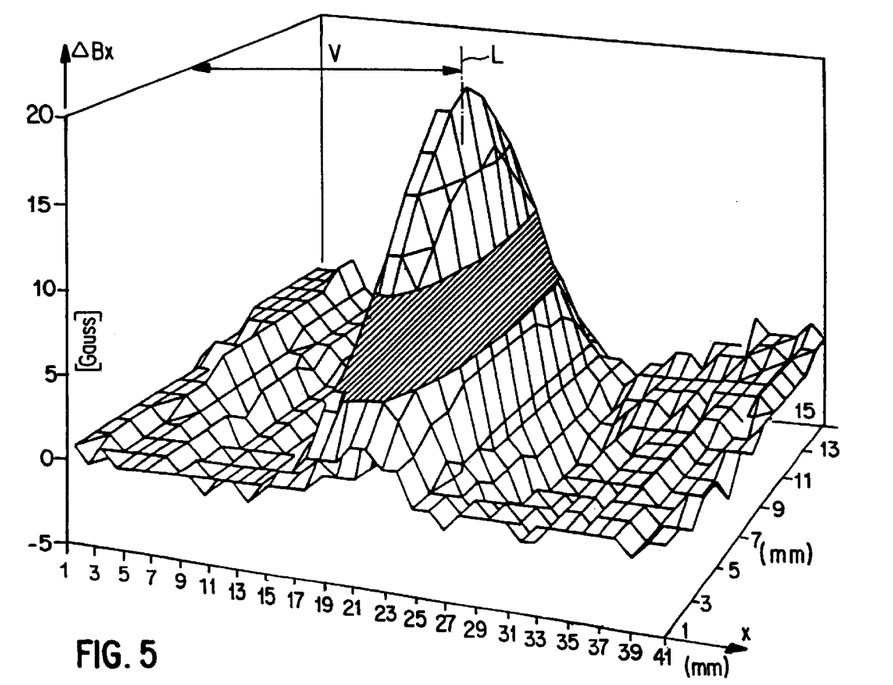
FIG. 5 is a three dimensional graph of a calculated stray field elevation on an offset individual blind hole on one embodiment of the target of the source according to the present invention.

In FIG. 5, $\Delta B_x$, is received at a height of 5 mm above a 4 mm individual hole in a Ni target of a thickness of 11 mm, with a magnet system, as used on the magnetron source AK 517, which is commercially available from Balzers AG of Liechtenstein.

Figure 6:
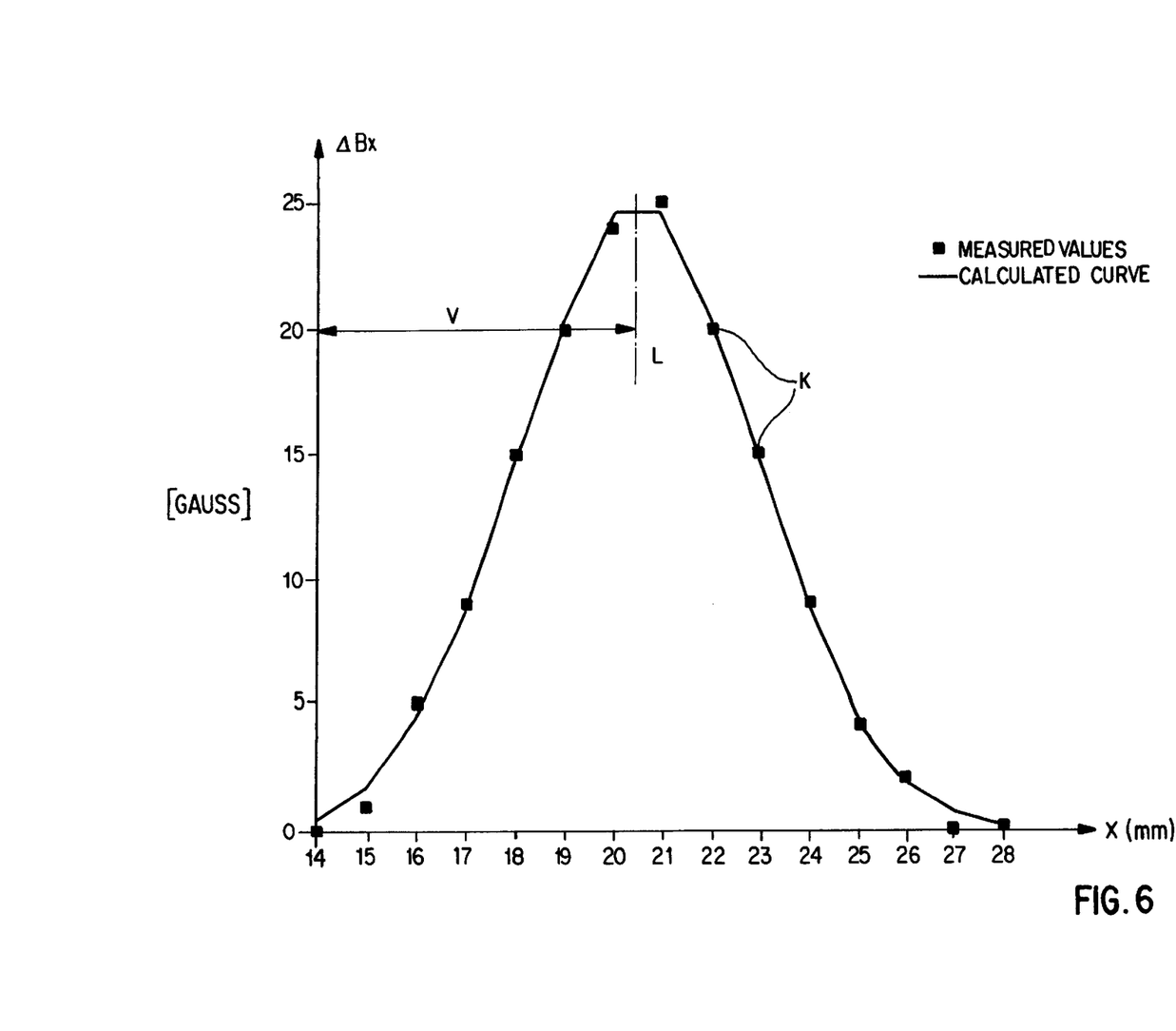
FIG. 6 is a graph of the comparison of the stray field elevation calculated according to FIG. 5 with the measured one in the x-direction of an x/y/z-system of coordinates as defined below.

Point markings K in FIG. 6 illustrate values of $\Delta B_x$, measured on a 4 mm individual blind hole in the 11 mm nickel target with the above-mentioned magnet system as well as the adapted course or plot calculated by way of a Gauss function. The match is clearly demonstrated.

Figure 7:
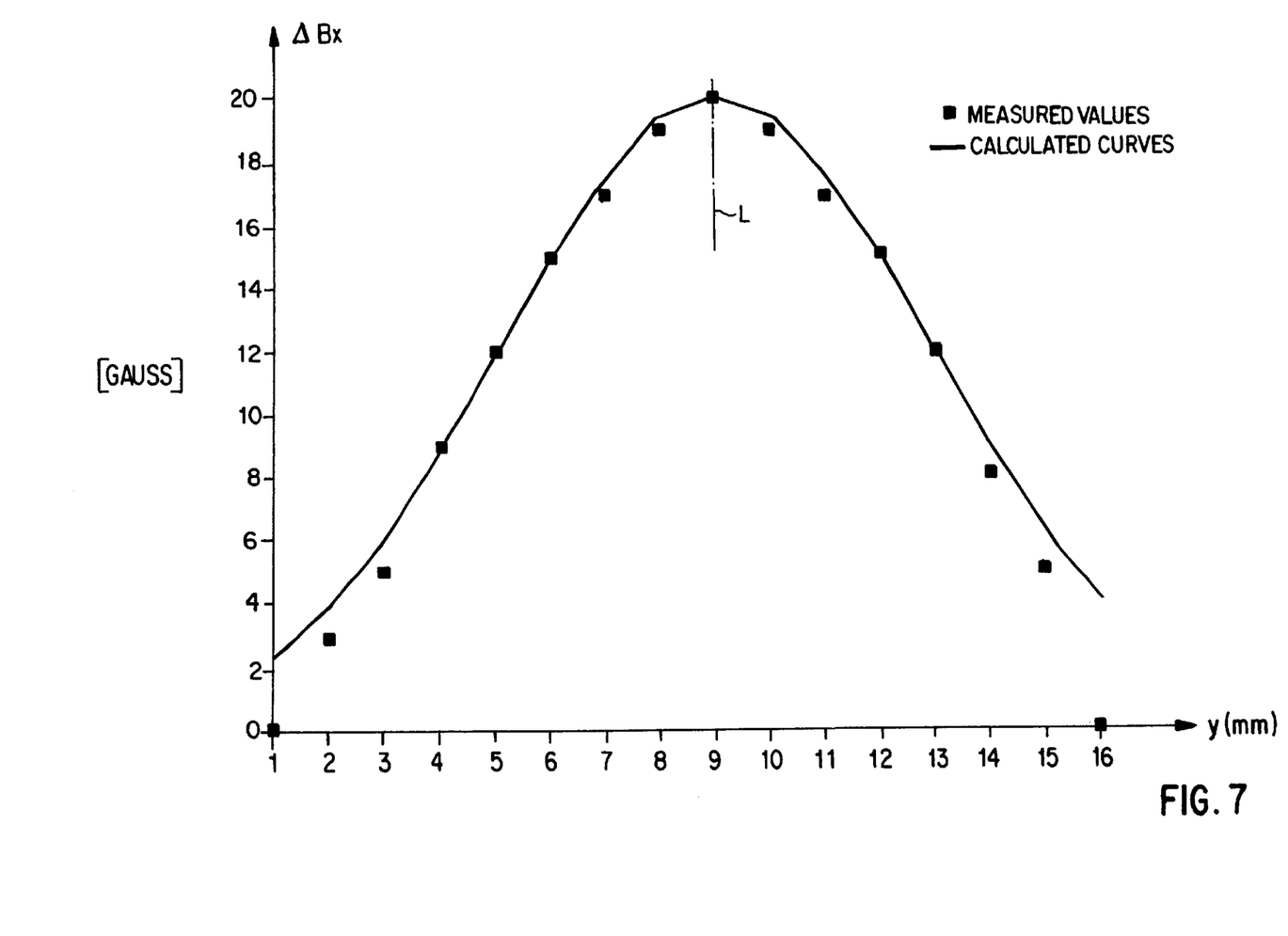
FIG. 7 is a graph similar to FIG. 6, viewed in the y-direction.

While FIG. 6 shows the course or path of the magnetic field elevation $\Delta B_x$, similar to the Gauss function in a z/x plane, FIG. 7 shows the above-mentioned comparison on the same individual blind hole, viewed in the z/y plane, in each case through hole center L.

Figure 8:
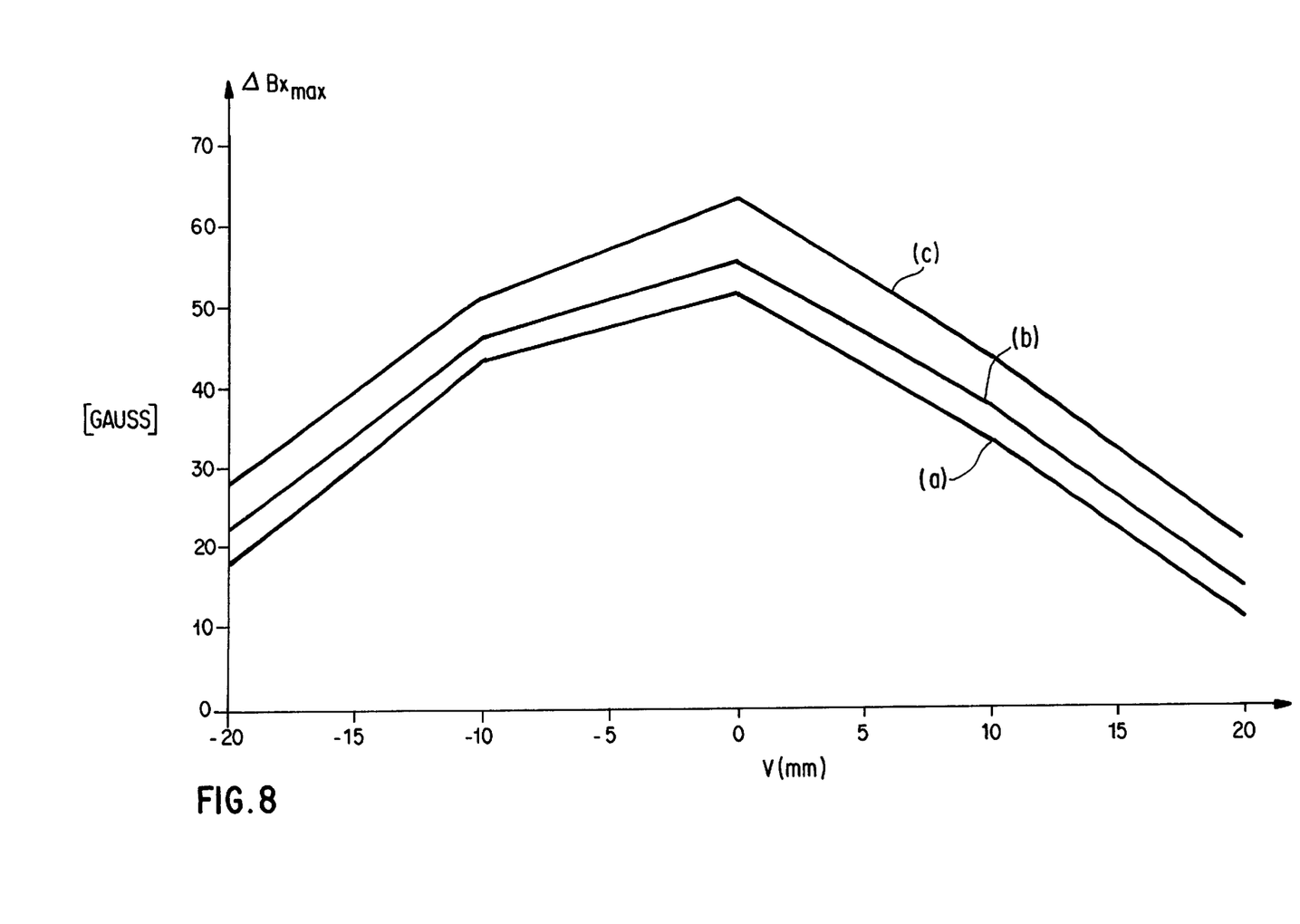
FIG. 8 is a graph of the course of the maximal stray field elevation on three individual blind holes of different diameters in the case of a different offset as defined below.

FIG. 8 shows, as a function of V, for individual blind holes of the diameters 4 mm (a), 5 mm (b), 6 mm (c) in a 11 mm Ni target, when the above-mentioned magnet system is used, the maximum magnetic field elevation $\Delta B_{xmax}$, measured over 5 mm of the new surface and the respective hole center L.

Figure 9:
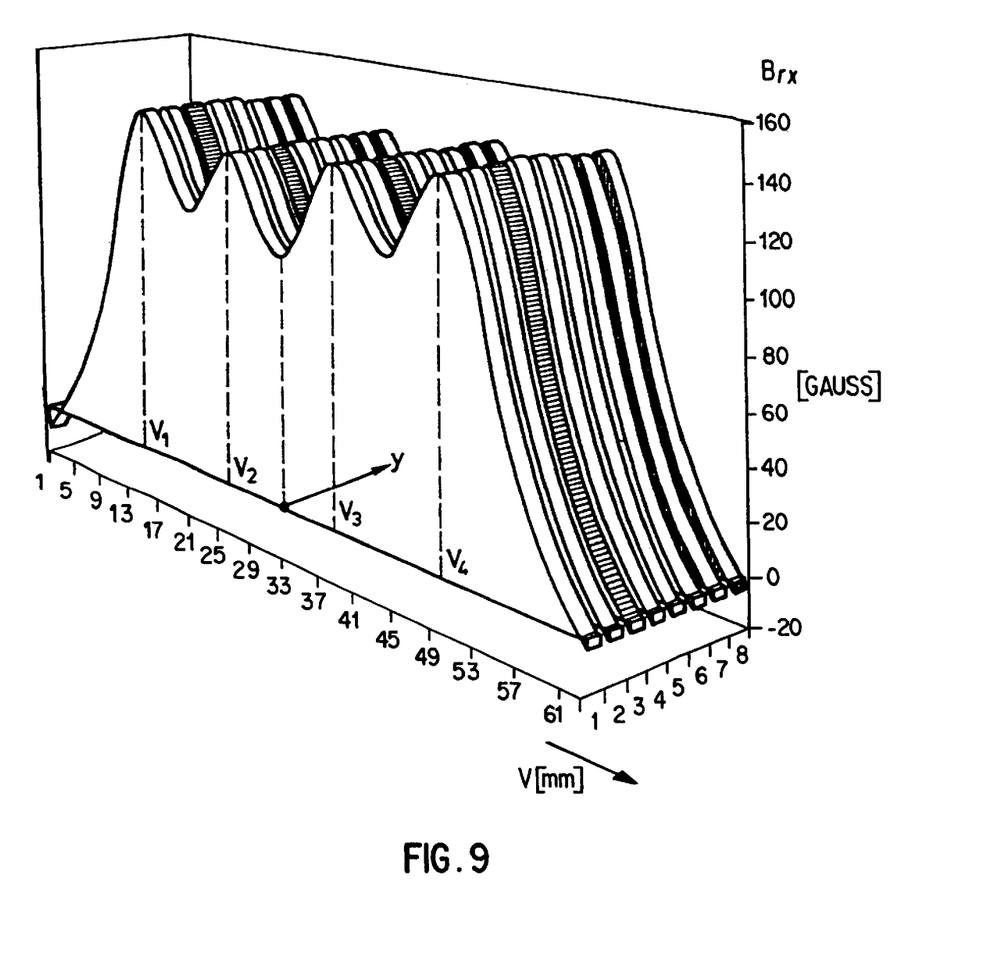
FIG. 9 is a three-dimensional graph of the course or shape of the magnetic field caused by a superposition in the case of four blind holes situated side-by-side.

FIG. 9 shows the resulting magnetic field $B_{rx}$ if, with the corresponding offset $V_1$ to $V_4$ in T and centered with respect to the y-tunnel axis, four pocket bores are provided, each of a diameter of 4 mm, again in an Ni target of a thickness of 11 mm and with the above-mentioned magnet arrangement. This demonstrates that $B_{rx}$ can be determined, here, measured or calculated at a height of 5 mm over the sputtering surface, by the additive superposition of the Gauss-type distributions of $B_{lx}$, and $\Delta B_x$, of the individual blind holes.

Figure 11:
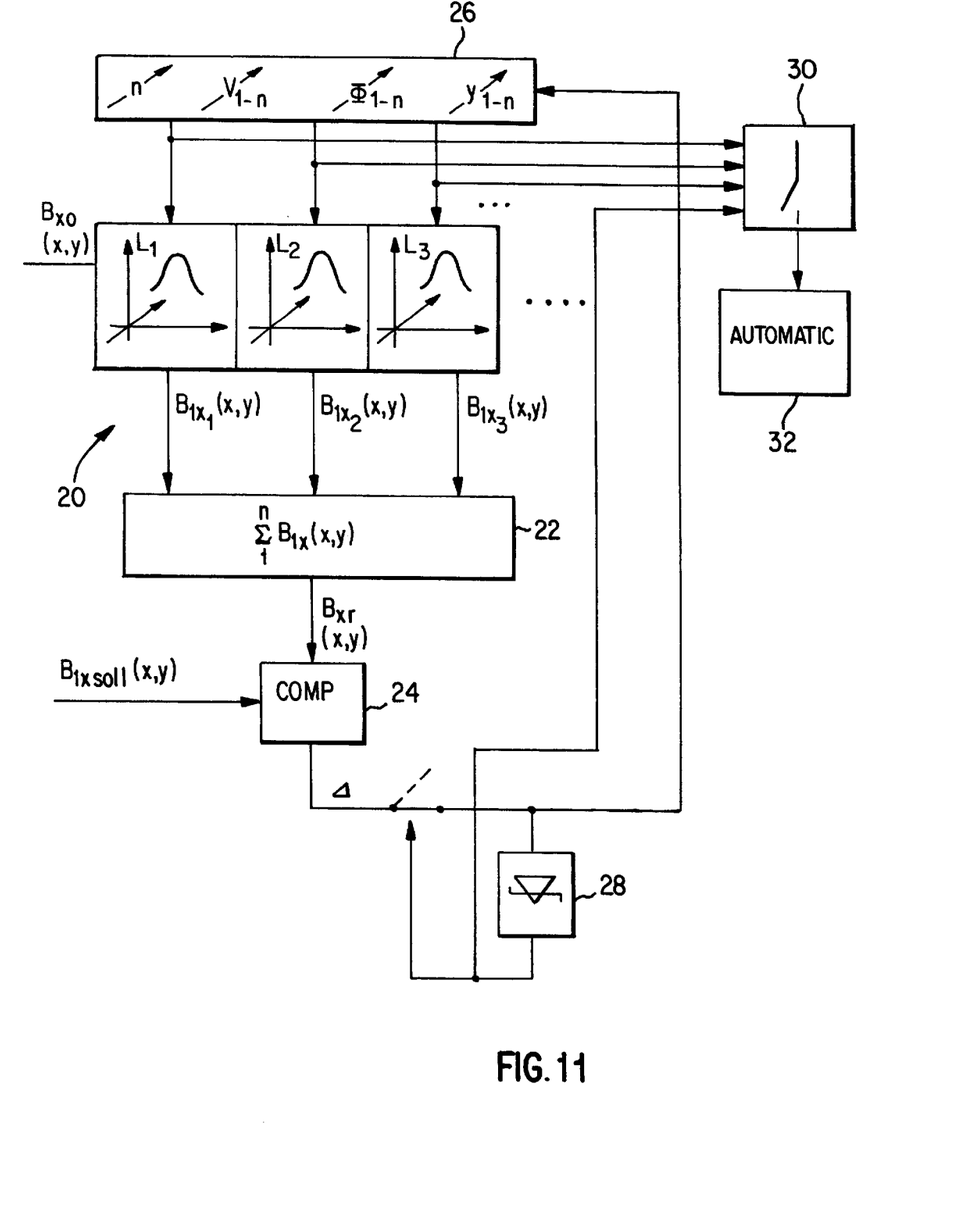
FIG. 11 is a schematic view of a function block/signal flow diagram of a target producing system operating according to the process of the invention.

The function block signal flow diagram of FIG. 11 shows the production process according to the invention, on the one hand, and the construction of a system for its implementation, on the other hand. By a given number of n individual bore holes, with a given magnetic field $B_{xo}(x,y)$ distribution, with one given offset $V_{1-n}$, respectively, a given diameter $\Phi_{1-n}$, and the given y-position $y_{1-n}$, further, in the case of a given hole profile and a given inclined position and in the case of a given target thickness, the measured or calculated individual hole magnetic fields $B_{lx1-n}$ are fed into a computer 20. These are additively superimposed on the computer unit 22. This results in the course of the magnetic field $B_{rx}$ (x, y); corresponding to the summation of the individual-hole magnetic-field courses, for example, according to FIG. 5, in the resulting magnetic field course, for example, according to FIG. 9.

In a comparison unit 24, the calculated resulting course $B_{xr}$ (x,y) is compared with a given DESIRED course $B_{lxDESIRED}$ (x,y) The resulting deviation course $\Delta$ causes an automatic change to take place on the defining unit for the $B_{lx}$ (x,y) 26, of the hole offsets $V_{1-n}$ and/or the diameters $\Phi_{1-n}$ and/or the hole positions x, y and/or the hole profiles and/or the diagonal hole positions and/or the target thickness until the resulting field course $B_{rx}$ (x,y) corresponds with the required precision to the DESIRED course $B_{rxDESIRED}$ (x,y). Then, as schematically illustrated by the comparator unit 28, the iterative feedback process Δ is interrupted. The then determined geometrical data for the position, the profile, the inclined position, the thickness and the hole diameter, as schematically illustrated with the switching unit 30, and, optionally by way of an intermediate storage, are transmitted to an automatic tool 32 for the target perforation.

With the definition of the DESIRED course $B_{rxDESIRED}$ (x,y), a stray field intensity is sought which is as high as possible, as well as a stray field profile over the new target surface which is as broad as possible. Furthermore, on the defining unit 26, preferably not only the above-mentioned hole parameters (specifically the geometrical position, the profile, the inclined position, the local thickness of the target plate) are varied but also the used hole number n in order to implement the DESIRED course with the required approximation, specifically with a blind hole number which is as low as possible. During the selection of the DESIRED field course, the experimental values over the corresponding course of the target erosion are taken into account.

Figure 10:
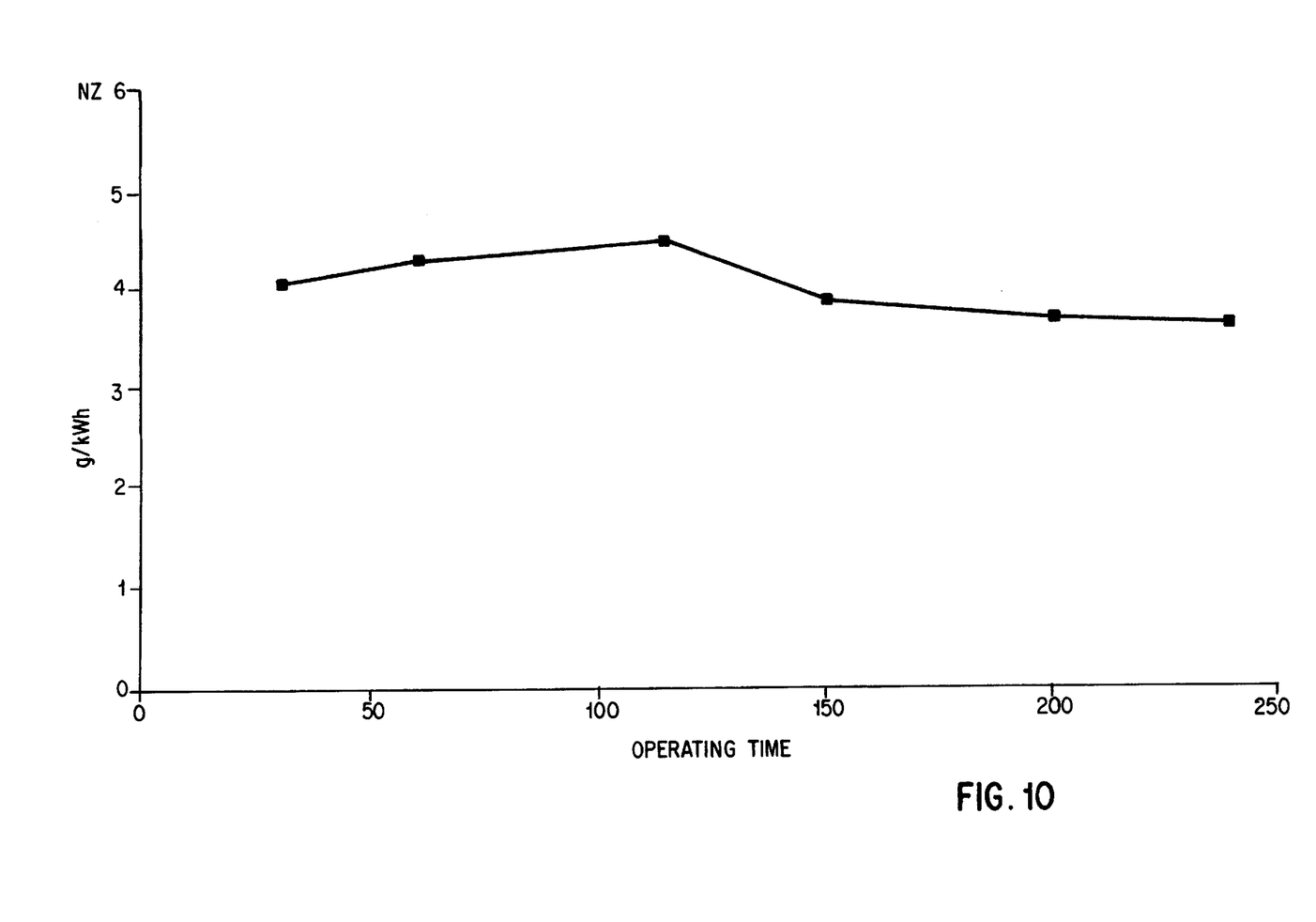
FIG. 10 is a graph of the course or path of the useful sputtering rate on a nickel target structured according to FIG. 4 as a function of the service life of the target.

In FIG. 10, the measured NZ is listed on an Ni target which is structured according to the invention and has a thickness of 11 mm with the dimension 5"×17", configured as illustrated in FIG. 4. FIG. 10 shows that, as a function of the target operating time in kWh, the utilized sputtered-off material rate decreases only insignificantly and the loss rate therefore increases only insignificantly.

In the target according to the present invention, for example according to FIG. 4, N was measured in the case of Ni targets according to the invention at 18%, in contrast to only 13% in the case of unstructured Ni targets.

The targets according to the present invention made of a ferromagnetic material allow use significantly thicker target plates and thus clearly lengthen the service life of the target. The provision of a carrier plate for the target is often not necessary. Compared to the non-blind-hole-profiled targets made of the same ferromagnetic material, the erosion troughs have little contraction. This results in a significant increase of N.

Furthermore, an improvement of NZ is determined with respect to the local homogeneity, which is explained by, among other things, the widening of the erosion trough. This demonstrates that a targeted distribution of the blind hole pattern permits the distribution of NZ to be targeted.

The establishment of a hole pattern in the target is extremely reasonable in cost, and, by way of the production process according to the invention, desired field courses of the tunnel field can be implemented in a targeted manner.

Figure 12:
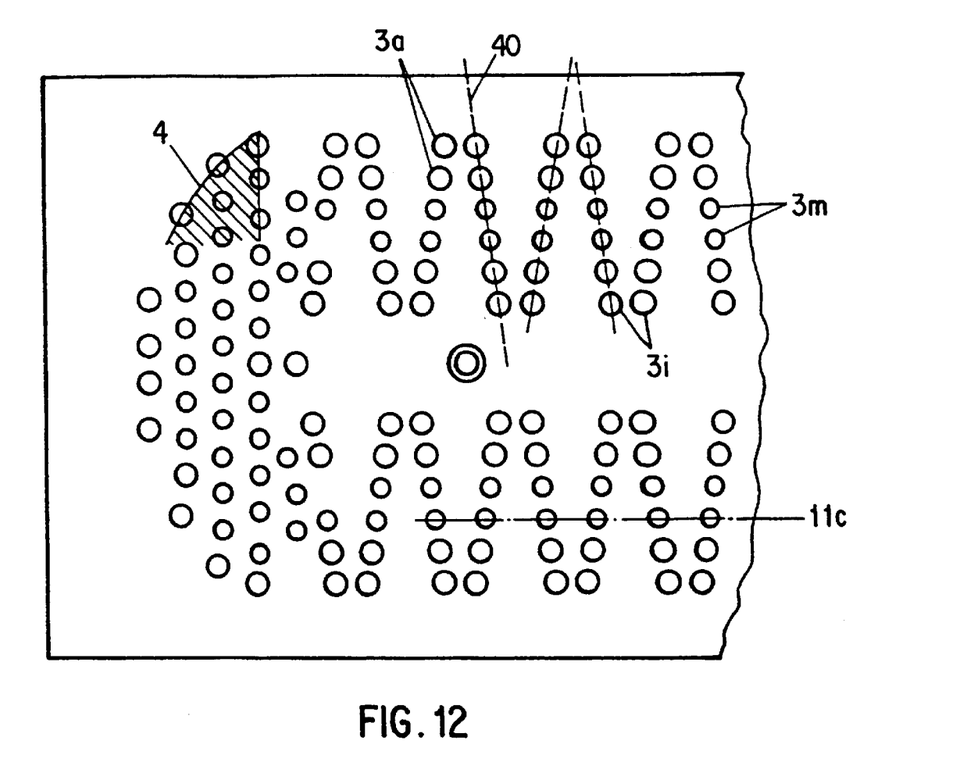
FIG. 12 is a partial plan view of a currently particularly preferred embodiment of a rectangular target according to the invention similar to FIG. 4.

Finally, FIG. 12 shows a particularly preferred pattern on a rectangular target. It comprises rows of holes 40 which, along the longitudinal sides of the target, are arranged toward the inside in a zig-zag-shape. The outer holes 3a, preferably two respectively, and the inner holes 3i, again preferably two, are larger than the central holes 3m, again preferably two. The diameter of holes 3a, 3i is preferably 5 mm and that of holes 3m is 4 mm. The holes 3 are again arranged in loop legs 11c. Along the broad sides of the target, the pattern essentially has a circular-segment shape, as illustrated at reference number 4, and is preferably spread out by rows of holes 3m, 3a in parallel to the target broad side. This pattern results in a particularly flat erosion trough which is independent of the target thickness.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. Magnetron target made of a ferromagnetic material, comprising a sputtering surface consisting of a matrix having a pattern of blind holes with a circular cross-section.

2. Magnetron target according to claim 1, wherein the pattern of blind holes is arranged essentially along at least one closed loop centered with respect to at least one of a target surface center and at least one target surface axis of symmetry.

3. Target according to claim 2, wherein the at least one closed loop comprises two closed loops and at least one additional loop is provided between the two closed loops defining outer loops, the diameters of the blind holes along the additional loop preferably being smaller than those along the two outer loops.

4. Target according to claim 1, wherein the pattern comprises rows of blind holes which extend in a zig-zag shape from the target surface edge toward a center thereof.

5. Target according to claim 4, wherein the pattern is rectangular, extends in a zig-zag pattern transversely to and along the longitudinal sides and, along broad sides thereof, at least approximately a circular-segment surface pattern, connects the zig-zag pattern.

6. Target according to claim 4, wherein the rows consist of pocket bores having outer bores of a larger diameter than inner bores.

7. Target according to claim 1, wherein the target consists of one of nickel and a nickel alloy including NiFe.

8. Target according to claim 1, wherein the blind hole diameters are situated in an area of from 3 mm to 6 mm.

9. Magnetron source having a target according to claim 1, wherein the blind hole distribution extends along that target area above which a source tunnel field is situated.

10. Magnetron source according to claim 9, wherein the blind hold distribution is essentially symmetrical to the location of a vanishing magnetic field intensity component perpendicular to a tunnel field new target surface.

11. Magnetron sputtering system having a magnetron source according to claim 9, wherein diameters of the blind holes are dimensioned such that cylindrical cathode discharge does not occur at system operating conditions.

* * * * *